United States Patent

Chu et al.

[11] Patent Number: 5,852,373
[45] Date of Patent: Dec. 22, 1998

[54] STATIC-DYNAMIC LOGIC CIRCUIT

[75] Inventors: Sam Gat-Shang Chu; Visweswara Rao Kodali; Michael Ju Hyeok Lee, all of Austin, Tex.

[73] Assignee: International Business Machines Corporation, Armonk, N.Y.

[21] Appl. No.: 723,814

[22] Filed: Sep. 30, 1996

[51] Int. Cl.⁶ .................. H03K 19/096; H03K 19/0948
[52] U.S. Cl. ................. 326/98; 326/21; 326/121
[58] Field of Search .................. 326/21, 31, 34, 326/93, 98, 121, 95

[56] References Cited

U.S. PATENT DOCUMENTS

| | | |
|---|---|---|
| 4,570,084 | 2/1986 | Griffin et al. . |
| 4,700,086 | 10/1987 | Ling et al. ............................. 326/93 X |
| 4,780,626 | 10/1988 | Guerin et al. ............................. 326/98 |
| 4,810,910 | 3/1989 | Schoellikopf et al. . |
| 4,849,658 | 7/1989 | Iwamura et al. . |
| 4,899,066 | 2/1990 | Aikawa et al. ............................. 326/98 |
| 5,065,048 | 11/1991 | Asai et al. . |
| 5,383,155 | 1/1995 | Ta . |
| 5,440,243 | 8/1995 | Lyon ..................................... 326/98 X |
| 5,457,404 | 10/1995 | Sharpe-Geisler . |
| 5,495,188 | 2/1996 | Chen et al. . |

*Primary Examiner*—Jon Santamauro
*Attorney, Agent, or Firm*—Kelly K. Kordzik; Winstead Sechrest & Minick P.C.; Anthony V. S. England

[57] ABSTRACT

A dynamic logic circuit is capable of receiving both dynamic and static input signals during both the precharge and evaluate phases of the logic circuit, and the static input signal is permitted to switch from both a low level to a high level and a high level to a low level during such stages and the logic circuit is still capable of correctly evaluating the implemented logical operation on the static and dynamic input signals. This is performed in CMOS by coupling a PFET between the internal precharge node and a voltage reference source where the gate electrode of the PFET device receives the static input signal.

5 Claims, 6 Drawing Sheets

STATIC-DYNAMIC LOGIC CIRCUIT

TECHNICAL FIELD

The present invention relates in general to data processing systems, and in particular, to dynamic logic circuitry.

BACKGROUND INFORMATION

A logic circuit is a circuit designed to perform a particular logical function based on the concepts of "and," "either-or," "neither-nor," etc. Normally, these circuits operate between two discreet voltage levels, i.e., high and low logic levels, and are described as binary logic circuits.

Binary logic circuits are the basic building blocks of data processing systems and almost any electronic computing device. Binary logic circuits are extensively used in computers to carry out instructions and arithmetic processes. Any logical procedure may be effected by using a suitable combination of these basic gates.

Because of their low powered dissipation, complementary CMOS (metal-insulator-semiconductor) field-effect transistors (FETs) are often used to construct such logic circuits.

Because logic circuits are often cascaded in a plurality of connected stages, clock pulses are applied to the elements of a logic circuit to effect logical operations, i.e., drive the logical circuit. Referring to FIG. 9, there is illustrated typical logic circuit 90, which may implement any logical function, having Data In inputs and a Data Out output. A Clock signal is inputted to logic circuit 90 in order to drive the Data In inputs through logic circuit 90 in order to effect the associated logical function implemented in logic circuit 90 upon the inputs in order to arrive at the solution, which is outputted as Data Out.

The periodic Clock signal also serves to prepare, or precharge, logic circuit 90 so that it is ready for the next series of Data In inputs subsequent to outputting the previous Data Out.

Referring next to FIG. 1, there is illustrated further detail of such a typical "domino" dynamic logic circuit, which in this example is a non-inverting buffer 10. An input signal to be evaluated is received at the gate electrode of N-channel FET ("NFET") 12, while P-channel FET ("PFET") 11 and NFET 13 both receive a clock input at their gate electrodes. (Please note that NFETs are designated with the letter N in the figures while PFETs are designated with the letter P.) Referring to FIGS. 1 and 2 in combination, an important limitation of this type of dynamic logic circuit may be seen. Note that during the precharge phase, the clock input precharges node 16 to a high level, and then during the evaluate phase, circuit 10 evaluates the input signal received by NFET 12 and outputs the evaluation through the optional half latch comprising PFET 14 and inverter 15.

The problem is that the input signal may change in either direction during the first part of the precharge phase, but at the end of the precharge phase and during the evaluate phase, the input signal may only change from a low level to a high level. The reason for this is that a changing input signal can cause the dynamic precharge of node 16 to lose its high level precharge condition and not be able to recover this high level if the logical input conditions are such that this is the desired logical condition. In other words, if during the evaluate phase the input signal transitions from a high level to a low level, it is possible that the output of circuit 10 may still be a high level even though this is not what is expected if the input signal is now at a low level.

This problem is more specifically stated as follows: during the evaluation phase, input signals may change if the change is from a low to a high, but may not change from a high to a low. This condition can occur when a "static signal" is fed into the dynamic circuit (ie., the static signal is converted to dynamic timing). A typical "static signal" can be expected to change state almost anywhere within a timing cycle.

As a result of the foregoing, there is a need in the art for a logic circuit that is capable of operating satisfactorily while receiving both static and dynamic input signals.

SUMMARY OF THE INVENTION

The present invention addresses the foregoing need by providing a logic circuit that receives both static and dynamic input signals and also provides for an ability to receive a change in the static input signal during the evaluate stage of the dynamic circuit.

In one embodiment of the present invention, the static signal is also received by a PFET coupled to the precharged node of the logic circuit, so that if the static signal changes from a high to a low signal during the evaluate phase, the logic circuit will still be able to properly evaluate the combination of static and dynamic signals inputted into the logic circuit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION

Figure 1:
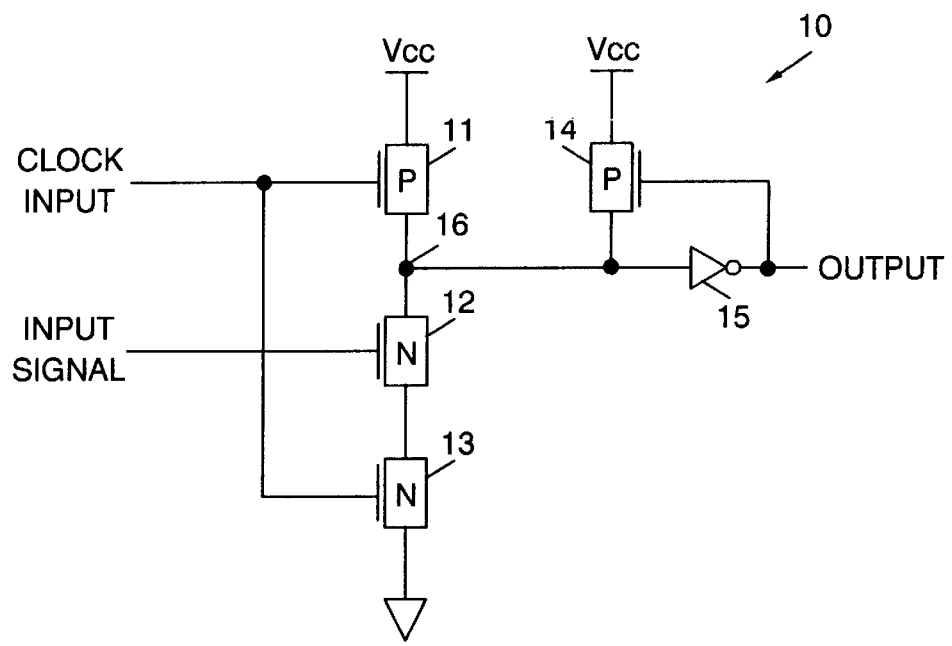
FIG. 1 illustrates a prior art dynamic logic circuit.
Figure 2:
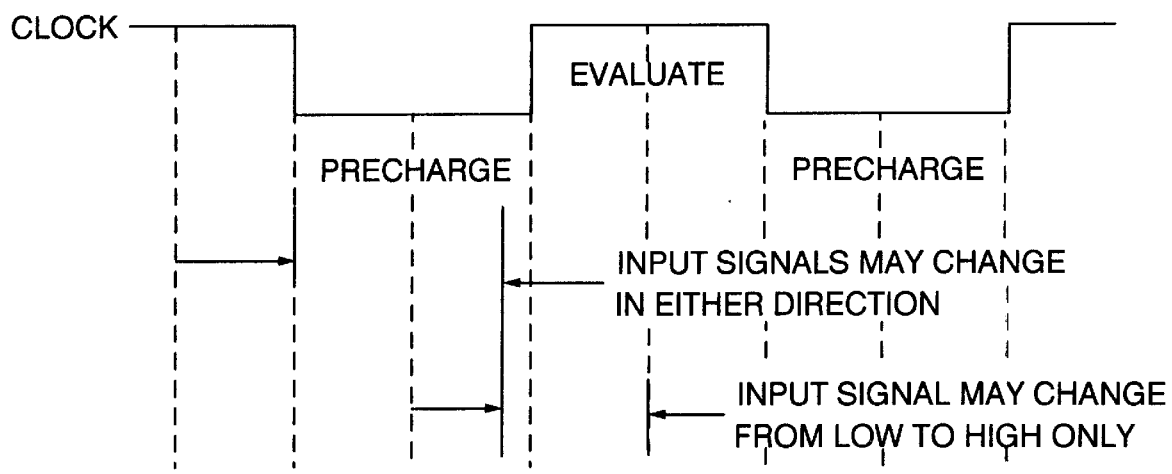
FIG. 2 illustrates the precharge and evaluate phases for the dynamic inverter illustrated in FIG. 1.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 3:
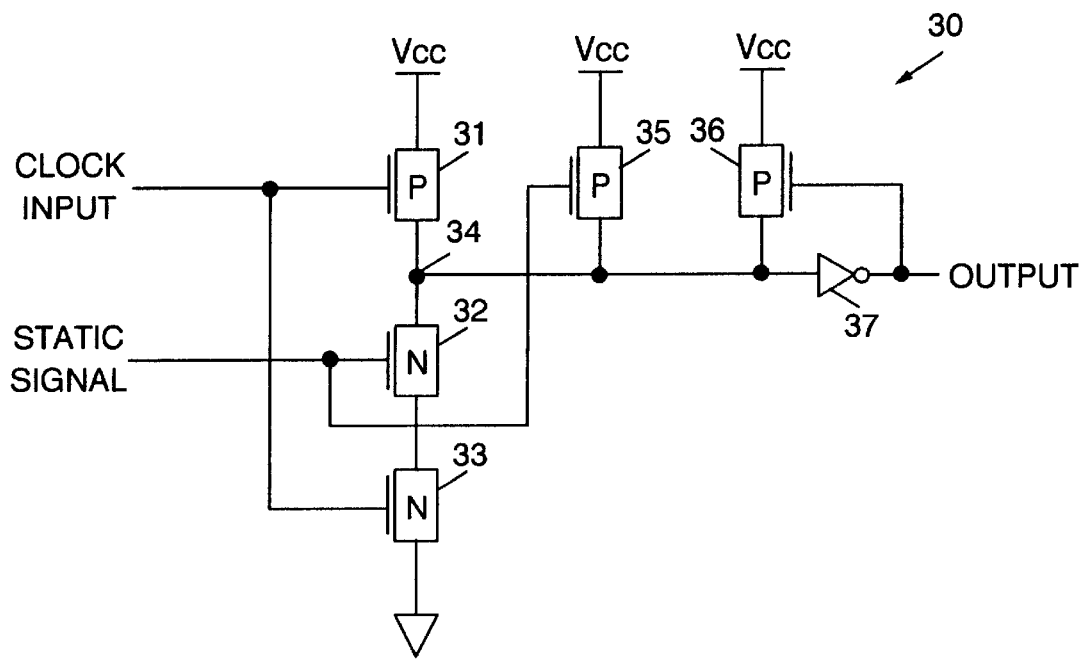
FIG. 3 illustrates one embodiment of the present invention.
Figure 4:
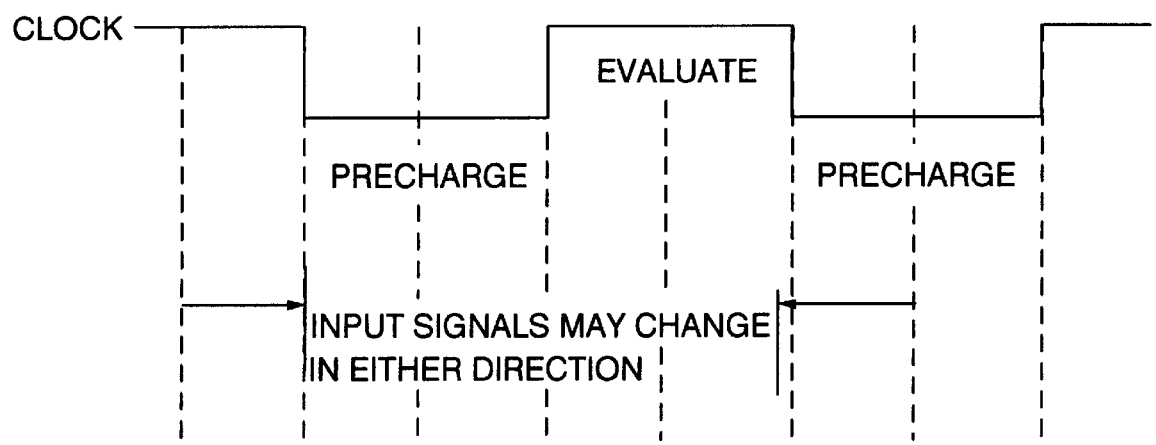
FIG. 4 illustrates a timing diagram for an operation of the logic circuit illustrated in FIG. 3.

Referring to FIG. 3, there is illustrated logic circuit 30 comprised of PFET 31 coupled between voltage reference source VCC and node 34, NFETs 32 and 33 coupled in series between node 34 and a second voltage reference source, PFET 35 coupled between VCC and node 34, and a half latch (which is optional) comprised of PFET 36 and inverter 37 at the output of logic circuit 30. Note that the static input signal received by the gate electrode of NFET 32 is also received by the gate electrode of PFET 35. PFET 35 allows the internal precharged node 34 to recover to a high or positive level when the clock input signal is at a high level and PFET 31 is turned off. The result is that the static input signal may change state at the end of the precharge phase and well into the evaluation phase and still be able to recover the precharged high level at internal node 34. This is further illustrated in FIG. 4 which shows that the static input signal may change in either direction during both the precharge and evaluate phases of logic circuit 30.

As an example of what logic circuit 30 permits, if during the evaluate phase of logic circuit 30 the static input signal switches from a high level to a low level, then the desired and correct output level should be a low level. However, without PFET 35 this would not occur, since when the static input signal changes from a high level to a low level, the input node 34 has already been discharged to ground through NFETs 32 and 33 when the static input signal was a high level at the beginning of the evaluate stage. However, with the inclusion of PFET 35, the low level static input signal arriving at the gate electrode of PFET 35 raises the voltage level of node 34 back to a high level, which is then inverted by inverter 37 to a low level, which is the correct output level under this condition.

Figure 5:
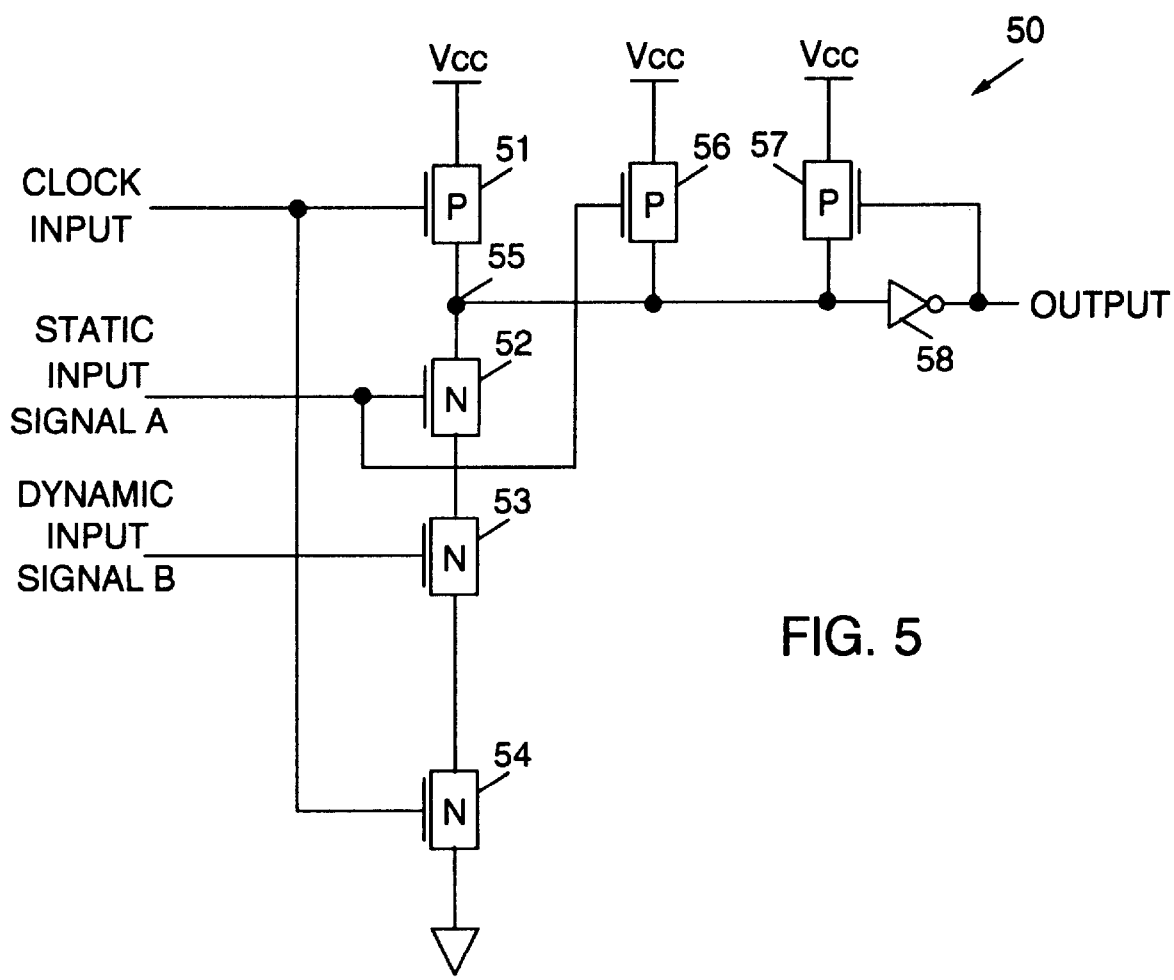
FIG. 5 illustrates an alternative embodiment of the present invention.

Referring next to FIG. 5, there is illustrated a more complex logical function performed by logic circuit 50, which also utilizes the present invention. NFET 52 receives static input signal A while NFET 53 receives dynamic input signal B. PFET 56 also receives static input signal A. The remainder of logic circuit 50 is similar to logic circuit 30. All other logical combinations also may be made possible for a full range of logical circuit operations using the present invention. A typical OR circuit is obtained by puffing the input NFET devices in parallel and the corresponding PFET pull-up devices in series. Complex logical operations are also found with complex series and parallel combinations of multiple input NFET devices and complimentary parallel/ series combinations of their corresponding load devices.

Figure 6:
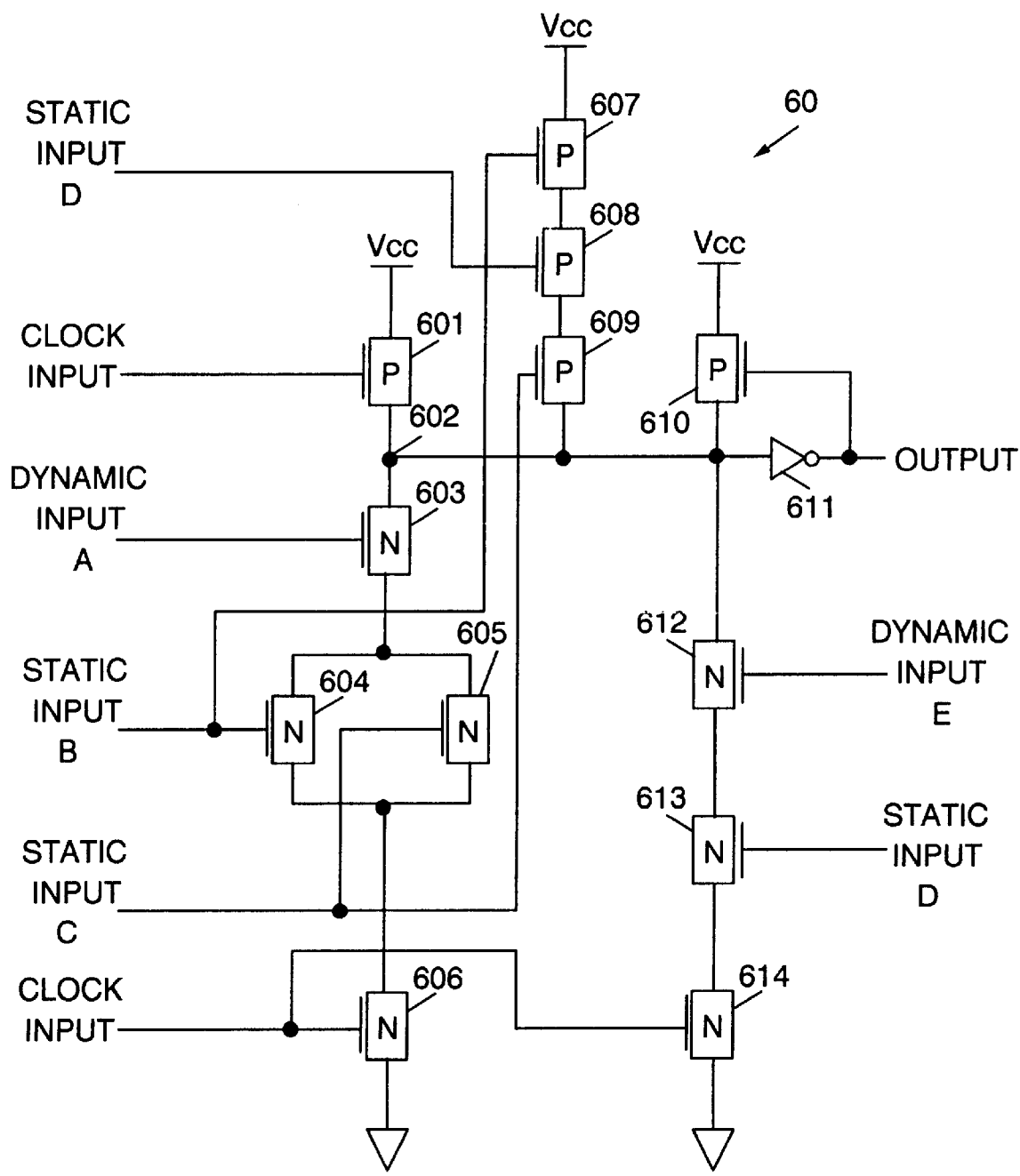
FIG. 6 illustrates yet another alternative embodiment of the present invention.

Referring next to FIG. 6, there is illustrated a complex logic AOI (and or invert) configuration using both static and dynamic input signals. Logic circuit 60 comprises precharge device 601 precharging node 602, NFETs 603 and 612 receiving dynamic input signals, NFET 604, 605 and 613 receiving static input signals, and NFETs 606 and 614 receiving clock input signals. PFETs 607-609 also receive the static input signals including PFET 608 receiving static input signal D. Circuit 60 permits any one or more of the static input signals to change from a high to a low level during the evaluate phase.

Figure 7:
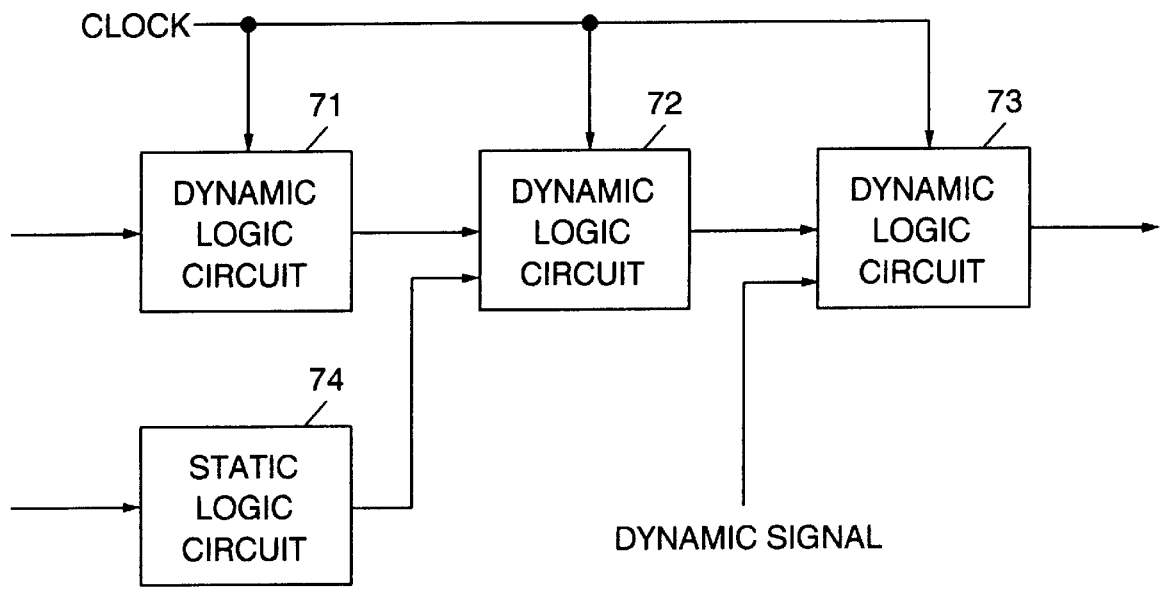
FIG. 7 illustrates an implementation of the present invention.
Figure 9:
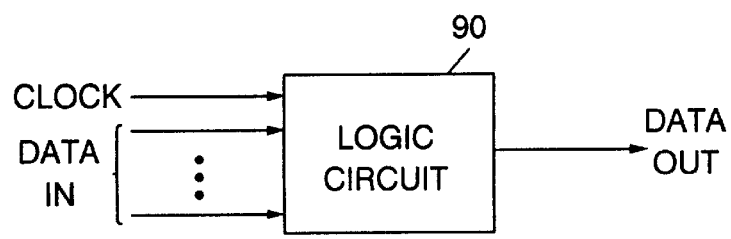
FIG. 9 illustrates a prior art dynamic logic circuit.

Referring next to FIG. 7, there is illustrated, in block diagram form, the concept of the present invention where a plurality of dynamic logic circuit 71-73 are coupled in some type of combination, such as the shown series combination. Each of the dynamic logic circuits 71-73 requires a clock signal for operation. However, dynamic logic circuit 72 also receives a static input signal from static logic circuit 74. As discussed above, this static input signal may switch voltage levels at any time during the precharge and evaluate phases of dynamic logic circuit 72. Logic circuit 73 will also include a PFET (not shown) similarly positioned as PFET 56 in FIG. 5 in order to account for the static signal input from logic circuit 72. Logic circuit 73 may also receive dynamic input signals from other circuits (not shown).

For purposes of discussion herein, a static signal is not controlled by a clock edge (signal), while a dynamic signal is triggered by a clock signal edge.

Figure 8:
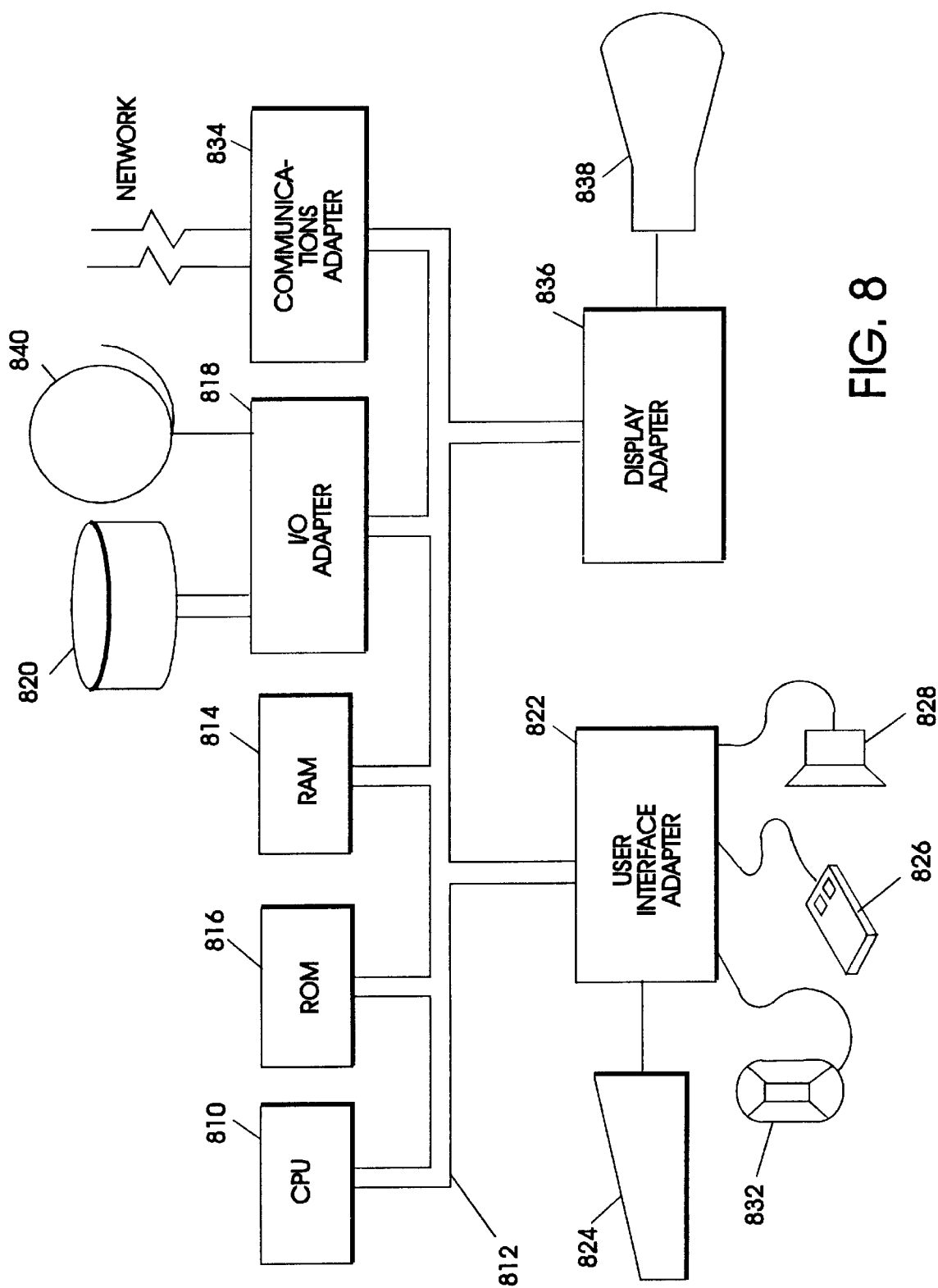
FIG. 8 illustrates a data processing system configured in accordance with the present invention.

A representative hardware environment for practicing the present invention is depicted in FIG. 8, which illustrates a typical hardware configuration of a workstation in accordance with the subject invention having central processing unit (CPU) 810, such as a conventional microprocessor, and a number of other units interconnected via system bus 812. The workstation shown in FIG. 8 includes random access memory (RAM) 814, read only memory (ROM) 816, and input/output (I/O) adapter 818 for connecting peripheral devices such as disk units 820 and tape drives 840 to bus 812, user interface adapter 822 for connecting keyboard 824, mouse 826, speaker 828, microphone 832, and/or other user interface devices such as a touch screen device (not shown) to bus 812, communication adapter 834 for connecting the workstation to a data processing network, and display adapter 836 for connecting bus 812 to display device 838. CPU 810 may include other circuitry not shown herein, which will include circuitry commonly found within a microprocessor, e.g., execution unit, bus interface unit, arithmetic logic unit, etc. CPU 810 may also reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A static-dynamic logic circuit comprising:

A first PFET having a drain coupled to a first supply voltage, a gate receiving a clock signal, and a source coupled to an evaluation node, said evaluation node being further coupled to an input of an inverter, said inverter having an output for outputting a logical data value;

a first NFET having a drain coupled to said evaluation node, a gate receiving a first dynamic input signal, and a source coupled to drains of parallel connected second and third NFETs, a gate of said second NFET receiving a first static input signal and a gate of said third NFET receiving a second static input signal;

a fourth NFET having a drain connected to parallel connected sources of said second and third NFETs, a gate receiving said clock signal, and wherein a source of said fourth NFET is connected to a second supply voltage;

a fifth NFET having a drain connected to said evaluation node, and a gate receiving a second dynamic input signal;

a sixth NFET having a drain connected to a source of said fifth NFET, and a gate receiving a third static input signal;

a seventh NFET having a drain coupled to a source of said sixth NFET, a gate receiving said clock signal, and a source connected to said second supply voltage;

a second PFET having a drain connected to said first voltage source, and a gate receiving said third static input signal;

a third PFET having a drain coupled to a source of said second PFET, and a gate receiving said second static input signal;

a fourth PFET having a drain coupled to a source of said third PFET, a gate receiving said first static input signal, and a source connected to said evaluation node; and a fifth PFET having a drain coupled to said first supply voltage, a gate coupled to said output of said inverter, and a source coupled to said input of said inverter.

2. A static-dynamic logic circuit comprising:

first and second NFETs having source-drain paths connected in parallel, said first NFET having a gate receiving a first static input signal, and said second NFET having a gate receiving a second static input signal;

a third NFET connected between a first end of said parallel connected source-drain paths of said first and second NFETs and an evaluation node, said third NFET having a gate receiving a first dynamic input signal;

a fourth NFET connected between a first voltage source and a second end of said parallel connected source-drain paths of said first and second NFTEs, said third NFET having a gate reciting a clock signal;

a first PFET coupled between a second voltage source and said evaluation node, wherein said first PFET has a gate receiving said clock signal;

second and third PFETs having series connected source-drain paths wherein a first end of said series connected source drain paths is coupled to said second voltage source and a second end of said series connected source-drain paths is connected to said evaluation node, said second PFET having a gate receiving said first static signal, and said third PFET having a gate receiving said second static signal;

a fifth NFET having a gate receiving a second dynamic input signal; and a sixth NFET having a gate receiving said clock signal, wherein a first end of a source-drain path of said fifth NFET is coupled to said evaluation node, a second end of said source drain path of said fifth NFET is coupled to a first end of a source-drain path of said sixth NFET, a second end of said source-drain path of said sixth NFET being coupled to said first voltage source.

3. The static-dynamic logic circuit of claim 2 further comprising:

a seventh NFET having a source drain path interposed between said second end of said source drain path of said fifth NFET and said first end of a source-drain path of said sixth NFET, said seventh NFET having a gate receiving a third static input signal.

4. The static-dynamic logic circuit of claim 3 further comprising:

a fourth PFET having a gate receiving said third static input signal and a source-drain path interposed between said series connected source-drain paths of said second and third PFETs and said evaluation node.

5. The static-dynamic logic circuit of claim 4 further comprising:

an inverter having an input coupled to said evaluation node and a output for outputting a logic value; and a fifth PFET having a gate coupled to said inverter output and a source-drain path coupled between said second voltage source and said evaluation node.

* * * * *